United States Patent
Park

(10) Patent No.: US 9,048,133 B2
(45) Date of Patent: Jun. 2, 2015

(54) SEMICONDUCTOR DEVICE AND METHOD FOR MANUFACTURING THE SAME

(75) Inventor: Dae Sik Park, Icheon-si (KR)

(73) Assignee: SK Hynix Inc., Icheon (KR)

( * ) Notice: Subject to any disclaimer, the term of this patent is extended or adjusted under 35 U.S.C. 154(b) by 87 days.

(21) Appl. No.: 13/488,246

(22) Filed: Jun. 4, 2012

(65) Prior Publication Data

US 2013/0154101 A1  Jun. 20, 2013

(30) Foreign Application Priority Data

Dec. 16, 2011 (KR) .................. 10-2011-0136023

(51) Int. Cl.
*H01L 27/108* (2006.01)
*H01L 21/20* (2006.01)
*H01L 21/768* (2006.01)

(52) U.S. Cl.
CPC .... *H01L 27/10855* (2013.01); *H01L 21/76897* (2013.01)

(58) Field of Classification Search
CPC ............ H01L 27/108; H01L 27/10844; H01L 27/10823; H01L 27/10855; H01L 27/10885; H01L 27/10888; H01L 27/10808
USPC .................... 257/296, 297; 438/396
See application file for complete search history.

(56) References Cited

U.S. PATENT DOCUMENTS

| | | | |
|---|---|---|---|
| 4,864,374 A * | 9/1989 | Banerjee ................... | 257/68 |
| 5,049,957 A * | 9/1991 | Inoue et al. ................ | 257/296 |
| 6,171,926 B1 * | 1/2001 | Chun et al. ................ | 438/396 |
| 6,222,217 B1 * | 4/2001 | Kunikiyo ................... | 257/296 |
| 6,255,224 B1 * | 7/2001 | Kim ........................... | 438/723 |
| 6,703,657 B2 * | 3/2004 | Hwang et al. .............. | 257/296 |
| 6,759,704 B2 * | 7/2004 | Park ........................... | 257/306 |
| 6,861,313 B2 * | 3/2005 | Song .......................... | 438/253 |
| 7,049,203 B2 * | 5/2006 | Chung et al. ............... | 438/396 |
| 7,145,195 B2 * | 12/2006 | Park et al. .................. | 257/296 |
| 7,235,452 B2 * | 6/2007 | Kang et al. ................. | 438/396 |
| 7,307,305 B2 * | 12/2007 | Lee et al. ................... | 257/296 |
| 7,312,489 B2 * | 12/2007 | Bae ............................. | 257/296 |
| 7,563,708 B2 * | 7/2009 | Jung ........................... | 438/637 |
| 8,053,326 B2 * | 11/2011 | Park et al. .................. | 438/396 |
| 8,119,512 B1 * | 2/2012 | Lee ............................. | 438/597 |
| 8,314,195 B2 * | 11/2012 | Elisseeff .................... | 526/319 |
| 8,569,817 B2 * | 10/2013 | Kwon ........................ | 257/304 |
| 2003/0001180 A1 * | 1/2003 | Narimatsu et al. .......... | 257/296 |
| 2003/0001268 A1 * | 1/2003 | Oh ............................. | 257/758 |
| 2004/0183113 A1 * | 9/2004 | Park et al. .................. | 257/296 |
| 2004/0217406 A1 * | 11/2004 | Chung et al. ............... | 257/304 |
| 2005/0253179 A1 * | 11/2005 | Park ........................... | 257/301 |
| 2006/0202340 A1 * | 9/2006 | Park et al. .................. | 257/758 |
| 2008/0185683 A1 * | 8/2008 | Ohuchi ...................... | 257/532 |

(Continued)

*Primary Examiner* — David Zarneke

(57) ABSTRACT

A semiconductor device and a method for manufacturing the same are disclosed. In the semiconductor device, an upper part of a storage node contact plug is increased in size, and an area of overlap between a storage node formed in a subsequent process and a storage node contact plug is increased, such that resistance of the storage node contact plug is increased and device characteristics are improved. The semiconductor device includes at least one bit line formed over a semiconductor substrate, a first storage node contact plug formed between the bit lines and coupled to an upper part of the semiconductor substrate, and a second storage node contact plug formed over the first storage node contact plug, wherein a width of a lower part of the second storage node contact plug is larger than a width of an upper part thereof.

9 Claims, 8 Drawing Sheets

(56) References Cited

U.S. PATENT DOCUMENTS

| | | | |
|---|---|---|---|
| 2009/0176357 A1* | 7/2009 | Park | 438/586 |
| 2009/0289326 A1* | 11/2009 | Park et al. | 257/532 |
| 2011/0053369 A1* | 3/2011 | Jang et al. | 438/652 |
| 2011/0151676 A1* | 6/2011 | Ingle et al. | 438/763 |
| 2011/0233261 A1* | 9/2011 | Rao | 227/177.1 |
| 2011/0260226 A1* | 10/2011 | Hwang et al. | 257/296 |
| 2013/0161781 A1* | 6/2013 | Lee | 257/499 |
| 2013/0193549 A1* | 8/2013 | Lee | 257/508 |

* cited by examiner (i)

(ii)

(i)

(ii)

SEMICONDUCTOR DEVICE AND METHOD FOR MANUFACTURING THE SAME

CROSS-REFERENCE TO RELATED APPLICATION

The priority of Korean patent application No. 10-2011-0136023 filed on 16 Dec. 2011, the disclosure of which is hereby incorporated in its entirety by reference, is claimed.

BACKGROUND OF THE INVENTION

Embodiments of the present invention relate to a semiconductor device and a method for manufacturing the same, and more particularly to a semiconductor device including a buried gate, a storage node and a bit line, and a method for manufacturing the same.

A Dynamic Random Access Memory (DRAM) includes a plurality of unit cells, each of which includes a capacitor and a transistor. The capacitor is used to temporarily store data therein. The transistor is used to transmit data between a bit line and a capacitor in correspondence with a control signal (i.e., a word line) using the electric conductivity of a semiconductor device, which changes depending on environment. The transistor has three regions including a gate, a source and a drain, and charges between the source and the drain move in response to a control signal input to the gate. The charges between the source and the drain move through a channel region in accordance with the properties and operation of the semiconductor device.

When a general transistor is formed in a semiconductor substrate, a gate is formed in the semiconductor substrate, and impurities are doped at both sides of the gate to form a source and a drain. In this case, a region between the source and the drain under the gate becomes a channel region of the transistor. A transistor with a horizontal channel region occupies a predetermined area of a semiconductor substrate. Reducing the overall area of a complicated semiconductor memory apparatus is difficult due to the plurality of transistors contained in the semiconductor device.

If the overall area of the semiconductor memory apparatus is reduced, the number of semiconductor memory devices capable of being acquired from each wafer is increased, resulting in increased productivity. A variety of methods have been proposed to reduce the overall area of the semiconductor memory device. A representative method uses a recess gate wherein a recess is formed in a substrate and a gate is formed in the recess such that a channel region is formed along a curved surface of the recess, instead of using a conventional planar gate having a horizontal channel region. With the progress of the above recess gate, another method for burying the entirety of the gate in the recess to form a buried gate has also been proposed.

In the buried gate structure, an isolation gate has been used to form a bit line contact and a storage node contact in the form of a line type. However, when the isolation gate structure is employed, a leakage current in the cell area increases compared to the case where a trench-type device isolation film.

When patterning a bit line contact in the buried gate structure employing a trench-type device isolation film, the contact hole must be patterned as a hole type and a dry etch process must be used for such patterning. If the pattern size implementable in a given process is reduced, a contact hole pattern may not be defined on a mask. In addition, when etching a contact hole in an active region in a subsequent etch process, the active region may not be opened. If the pattern size is increased to prevent the above-mentioned problems, short-circuiting may occur between the contact hole and the storage node.

The storage node contact must be formed by a Self Aligned Contact (SAC) after bit-line formation, and contact resistance unavoidably increases as a contact area between the active region and the contact is reduced.

In order to solve the above-mentioned problems, a damascene bit line process has been proposed, which forms a bit line after forming a storage node contact (SNC).

If a damascene bit line process is used, two contiguous SNCs are formed simultaneously, and then each SNC is separated through a subsequent damascene process. Thereafter, a bit line is formed to bury the inside of the damascene pattern. As a result, the patterning caused by the damascene bit line process can be more easily performed than that of a process for independently forming each SNC. In addition, the damascene bit line process is more advantageous in terms of a self aligned contact (SAC) failure than a process in which the SNC is formed later.

In order to prevent the SAC failure from occurring, the size of a lower part of the damascene bit line must be reduced. However, it is difficult to reduce the size of the lower part of the damascene bit line. In addition, when reducing the size of the lower part of the damascene bit line, the size of an upper part of the damascene bit line may increase such that it is larger than the size of the lower part of the damascene bit line. As a result, the upper part of the storage node contact (SNC) plug is reduced in size, and the area of overlap between the SNC plug and a storage node is also reduced in size, resulting in an increase in contact resistance.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to a semiconductor device in which an upper part of a storage node contact plug is increase in size, and an overlap area between a storage node to be formed in a subsequent process and a storage node contact plug is increased, such that resistance of the storage node contact plug is increased and therefore device characteristics are improved, and a method for manufacturing the same.

In accordance with an aspect of the present invention, A semiconductor device comprising: first and second bit lines; first and second insulating patterns provided over the first and the second bit lines, respectively; a first storage node contact plug provided between the first and the second bit lines; and a second storage node contact plug coupled to the first storage node contact plug and provided between the first and the second insulating patterns, wherein a size of the second storage node contact plug at a top surface level of the second storage node contact plug is larger than a size of the second storage node contact plug at a bottom surface level of the second storage node contact plug.

The second storage node contact plug includes a first tapered configuration, and wherein any of the first and the second insulating patterns includes a second tapered configuration that is complementary to the second storage node contact plug.

A top surface of the first storage node contact plug extends to a higher level than top surfaces of the first and the second bit lines so that the second storage node contact plug is not coupled to any of the first and the second bit lines.

Top surfaces of first and second insulating patterns are formed at substantially the same level as a top surface of the second storage node contact plug.

In accordance with another aspect of the present invention, first and second bit lines; a first storage node contact plug formed between the first and the second bit lines; and a second storage node contact plug formed at a lateral surface of and upper part of the first storage node contact plug and disposed over any of the first and the second bit lines, wherein the second storage node contact plug is formed as a spacer over the bit line hard mask.

Each of the first and the second bit line include a bit line conductive pattern and a bit line hard mask.

Each of the first storage node contact plug and the second storage node contact plug includes polysilicon or metal.

An insulation material is formed over an upper part of each of the first and the second bit lines and is located between neighboring second storage node contact plugs.

The first storage node contact plug extends from a first level up to a second level, wherein the second storage node contact plug extends from a third level up to a fourth level, wherein the third level is between the first and the second levels, wherein the first storage node contact plug has a first size at the third level and has a second size at the second level, wherein the second storage node contact plug has a third size at the second level, and wherein a sum of the second size and twice the third size is larger than the first size.

In accordance with an aspect of the present invention, A method for manufacturing a semiconductor device comprising: forming a conductive line over a semiconductor substrate; forming first and second bit lines each coupled to the semiconductor substrate by patterning the conductive line, wherein the patterned conductive line between the first and the second bit lines forms a first storage node contact plug; forming first and second insulating patterns over the first and the second bit lines, respectively; providing a first contact hole between the first and the second insulating patterns; enlarging a size of the first contact hole by etching an upper sidewall of any of the first and second insulating patterns to form a second contact hole so that a size of a top opening of the second contact hole is larger than a size of a bottom opening of the second contact hole; and providing a second storage node contact plug in the second contact hole so that the second storage node contact plug is coupled to the first storage node contact plug.

The step of forming the first and the second bit lines and the step of forming the first and the second insulating patterns includes: forming first and second bit line grooves that each exposes a bit line region to form the first storage node contact plug; and filling first and second bit line conductive materials and first and second insulating materials in the first and the second bit line grooves, respectively.

The step of etching the upper sidewall of any of the first and the second insulating patterns includes: implanting impurity ions into the upper sidewall of any of the first and the second insulating patterns; and performing an etchback or a cleaning process to remove the upper sidewall which is subject to the impurity ion implantation.

The impurity ions are argon (Ar) ions. The step of implanting the impurity ions includes: performing a first ion implantation at a first tilt angle; and performing a second ion implantation at a second tilt angle different from the first tilt angle.

Each of the first storage node contact plug and the second storage node contact plug includes polysilicon or metal.

In accordance with another aspect of the present invention, A method for manufacturing a semiconductor device comprising: forming a conductive line over a semiconductor substrate; forming first and second storage node contact plugs by etching the conductive line, forming a bit line between first and second storage node contact plugs; forming a first contact hole over the bit line and between first and second storage node contact plugs; and forming a second storage node contact plug at a sidewall of the first contact hole so that the second storage node contact plug is coupled to the first storage node contact plug.

The step of forming the bit line further includes: forming a bit line groove that exposes a bit line contact region of the semiconductor substrate; and providing a stack of bit line conductive material and bit line hard mask material in the bit line in the bit line groove.

The step of forming the second storage node contact plug further includes: depositing conductive material in the first contact hole; and performing an etch-back process so that the conductive material remains only at a sidewall of the first storage node contact plug.

The method further comprising: forming a second contact hole by forming the second storage node contact plug is formed, filling insulation material in the second contact hole provided over the bit line to form an insulation pattern.

Each of the first storage node contact plug and the second storage node contact plug includes polysilicon or metal.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the accompanying drawings.

Figure 1A:
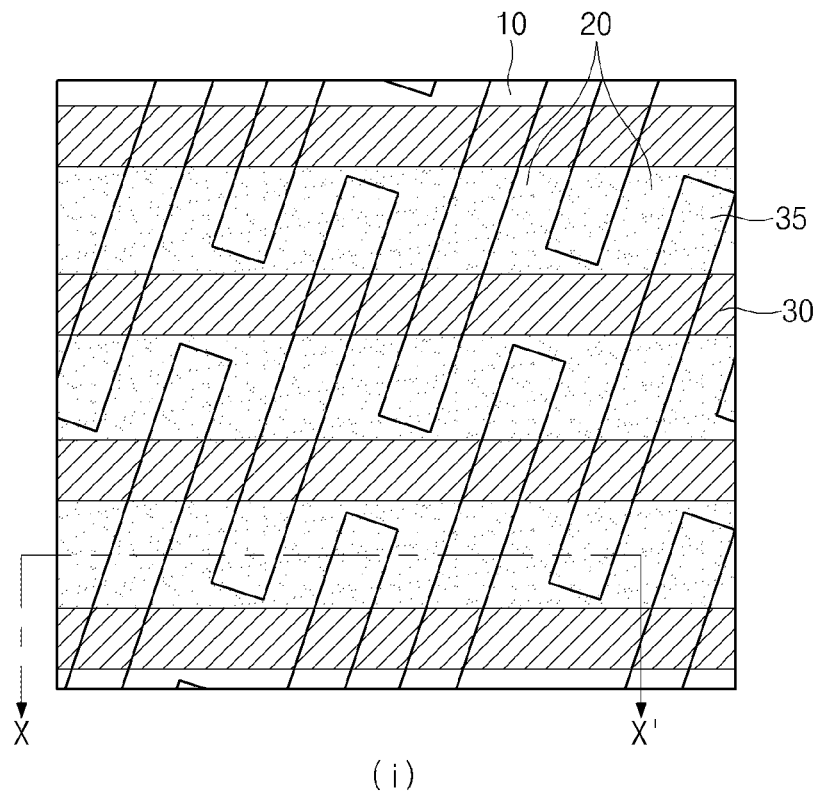
FIGS. 1A to 1E are plan views and cross-sectional views illustrating a semiconductor device and a method for manufacturing the same according to an embodiment of the present invention.
Figure 1A:
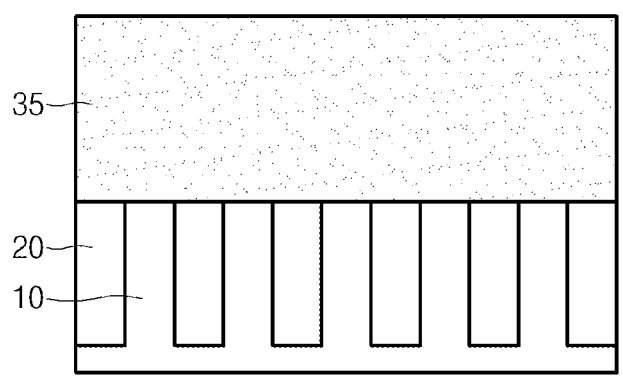

FIGS. 1A to 1E are plan views and cross-sectional views illustrating a semiconductor device and a method for manufacturing the same according to a first embodiment of the present invention. FIG. 1A(ii) is a cross-sectional view taken along the line X-X' of FIG. 1A(i), and FIG. 1B(ii) is a cross-sectional view taken along the line X-X' of FIG. 1B(i).

Referring to FIG. 1A, a mask pattern (not shown) formed to open a device isolation film region is formed over a semiconductor substrate. After a trench is formed by etching the semiconductor substrate using the mask pattern (not shown) as an etch mask, an oxide film is buried in the trench such that a device isolation film 20 is formed to define the active region 10. Thereafter, a trench having a predetermined depth is formed in the semiconductor substrate including the active region 10 and the device isolation film 20. The surface of the trench is oxidized so that a gate oxide film (not shown) is formed. A gate electrode material is buried in the trench including the gate oxide film (not shown) so that a buried gate is formed. The gate is not limited to a buried gate, and may be a different type, e.g., a recess gate, a fin gate, a planar gate, etc.

After that, an interlayer insulation film 30 is formed over the semiconductor substrate including the buried gate. Some parts of the interlayer insulation film 30 are etched, resulting in formation of a first contact hole (not shown) extending along the X-X' line and crossing the active regions 10. Thereafter, a conductive material is buried in the first contact hole, so that a conductive line 35 is formed. Preferably, the conductive line 35 may be polysilicon. That is, after a polysilicon layer is deposited over the semiconductor substrate including the first contact hole, the polysilicon layer formed over the interlayer insulation film 30 may be removed by a CMP or etch back process.

Figure 1B:
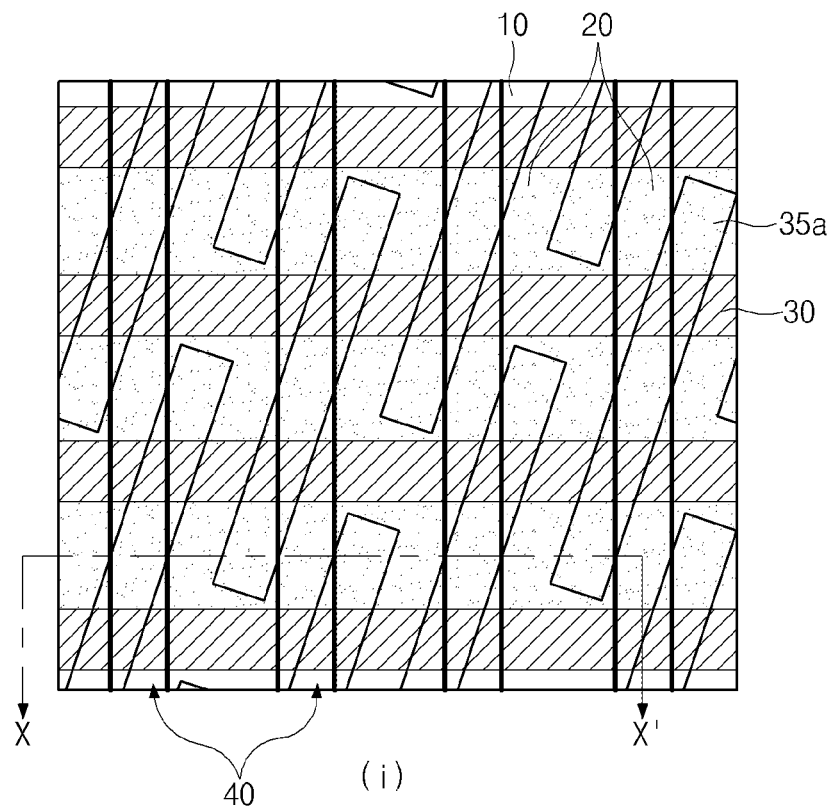
Figure 1B:
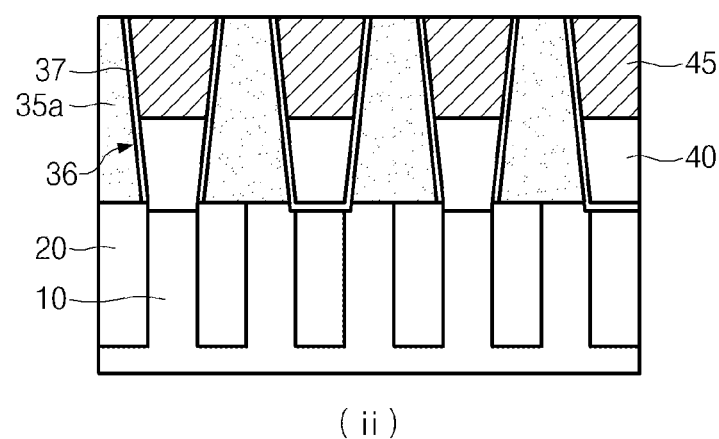

Referring to FIG. 1B, a hard mask pattern (not shown) defining a bit line region is formed over the interlayer insulation film 30 including the conductive line 35. In this case, the hard mask pattern (not shown) may be a nitride film. A bit line groove 36 is formed using the hard mask pattern (not shown) as a mask. The bit line groove 36 is formed by patterning the conductive line 35. As a result, the patterned conductive line 35 forms a first storage node contact plug 35*a* coupled to the active region 10. That is, by forming the bit line groove 36, the first storage node contact plug 35*a* is formed in a self-aligned manner. However, the present invention is not limited thereto. The bit line groove 36 may be formed prior to the first storage node contact plug 35*a* and vice versa.

Subsequently, a spacer insulation film 37 for insulating the bit line groove 36 is formed over the surface of the bit line groove 36, including the bottom and lateral surfaces of the bit line groove 36. Preferably, the spacer insulation film 37 may be formed of a material having a low dielectric constant (low permittivity), for example, a nitride film or an oxide film. The spacer insulation film 37 at the bottom of the bit line groove 36 that is disposed over an active region 10 is removed so that the active region 10 is exposed. In an embodiment, an upper part of the active region 10 may be partially etched when removing the spacer insulation film 37.

Then a bit line conductive layer 40 is formed in the bit line groove 36. It is preferable that the bit line conductive layer 40 be formed of tungsten (W), but it is not limited thereto. Thereafter, a bit line hard mask 45 (also, referred to as first and second insulating patterns) formed of, e.g., a nitride film, is formed over the bit line conductive layer 40. When the bit line hard mask 45 is formed, it is preferable that a nitride film is deposited over the entire surface and is then CMP-processed or etched back until the first storage node contact plug 35*a* is exposed, such that the bit line hard mask 45 remains only in the bit line groove 36.

Figure 1C:
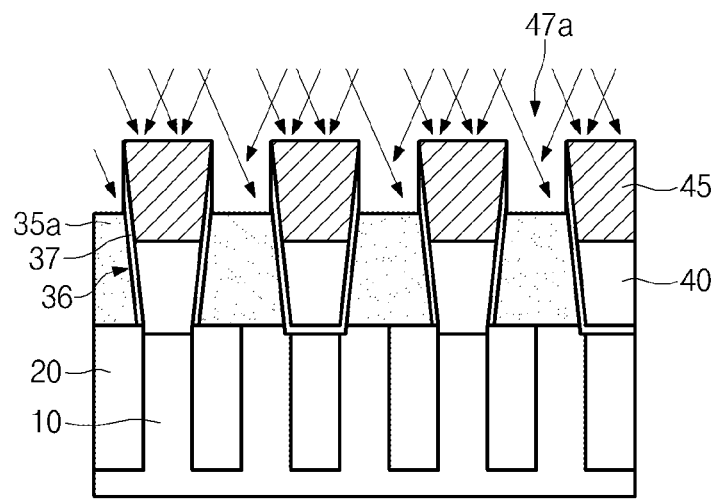

Referring to FIG. 1C, an upper part of the first storage node contact plug 35*a* formed between the bit line hard masks 45 may be partially etched to form a second contact hole 47*a* so that the bit line hard mask 45 protrudes. In an embodiment, the first storage node contact plug 35*a* may be formed of polysilicon, and the bit line hard mask 45 may be formed of a nitride film. Etching the upper portion of first storage node contact plug 35*a* may be performed using a difference in etch selection ratio between the polysilicon and the nitride film. As a result, only the first storage node contact plug 35*a* is partially etched by an etch-back process.

Subsequently, ions are implanted into the surface of the protruding bit line hard mask 45. In an embodiment, the ion implantation process may be performed by tilted ion implantation. More preferably, ion implantation may be performed at an acute angle with respect to a line perpendicular to the surface of the protruded bit line hard mask 45 such that ions can be uniformly implanted onto the bit line hard mask 45. In order to allow the ion-implanted part to have an amorphous state, impurity ions, for example, non-active ions such as argon (Ar), may be used. In an embodiment, tilted ion implantation may be performed in 2 steps. The first ion implantation process may be performed at a first angle, tilted by a first degree in a first direction with respect to the line perpendicular to the surface of the protruded bit line hard mask 45. The second ion implantation process may be performed at a second angle, tilted by a second degree in a second direction that is opposite to the first direction with respect to the line perpendicular to the surface of the protruded bit line hard mask 45. The first and the second degree may be the same or they may be different. For example, the first ion implantation angle may be set to 30°~60° with respect to the line perpendicular to the surface of the protruded bit line hard mask 45.

Figure 1D:
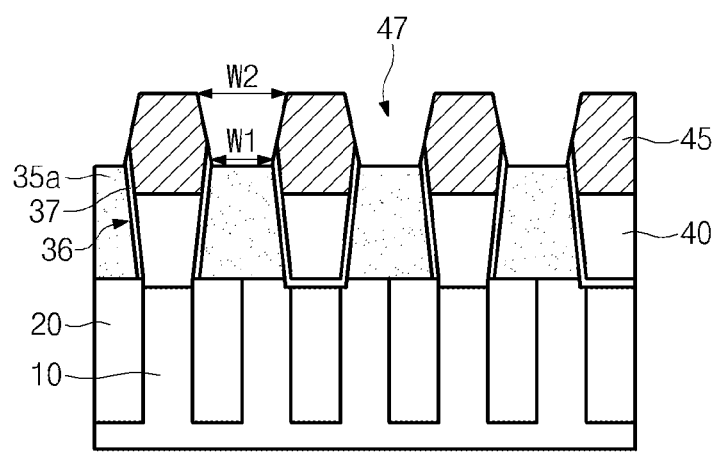

Referring to FIG. 1D, some parts of the protruded bit line hard mask 45 are etched such that a second contact hole 47 is formed to have a profile with a tilted or tapered sidewall. The process for etching some parts of the bit line hard mask 45 may be carried out by a dry etch-back process or a cleaning process. Since the etch rate of a region having an amorphous state is higher than an etch rate of the crystalline region, an edge part of the protruded bit line hard mask 45, where ions are more heavily implanted, is more quickly etched than the remaining regions, such that a tilted or tapered profile can be formed. When the cleaning process is performed, if argon (Ar) ions or the like are implanted into a target part, e.g., the corner of the protruded bit line hard mask 45, a cleaning selection ratio is increased. That is, the ion-implanted part is more rapidly etched by the cleaning process. Thus, if ion implantation is achieved by tilted implantation, the cleaning selection ratio of the protruded part can be effectively increased. As described above, an upper edge part of the bit line hard mask 45 is etched, and the second contact hole 47 is configured to have a tapered form, e.g., an inverted trapezoid. For example, a width (W2) of an upper-part of the second contact hole 47 is larger than a width (W1) of a lower-part.

Figure 1E:
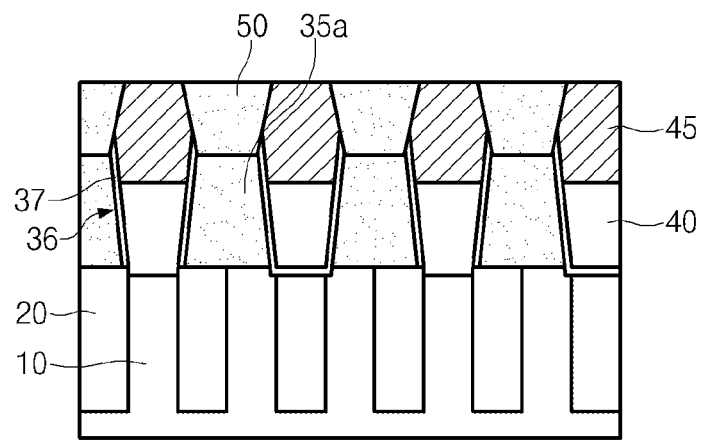

Referring to FIG. 1E, a conductive material is buried in the second contact hole 47 to form a second storage node contact plug 50 coupled to the first storage node contact plug 35*a*. Preferably, a conductive material buried in the second contact hole 47 may be polysilicon. That is, after a polysilicon layer is deposited over the semiconductor substrate including the second contact hole 47, the polysilicon layer formed over the bit line hard mask 45 may be removed by a CMP or etch-back process. The resultant second storage node contact plug 50 has advantages in that an upper part of the second storage node contact plug 50 is larger in size than the first storage node contact plug 35*a* shown in FIG. 1B or the conventional storage node contact plug, and an area of overlap between the second storage node contact plug 50 and a storage node that will be formed in a subsequent process is increased in size, resulting in reduction in contact resistance.

As described above, a method according to the first embodiment of the present invention can be performed as follows.

First and second bit lines 40 are provided. First and second insulating patterns 45 are provided over the first and the second bit lines, respectively. A first storage node contact plug 35*a* is provided between the first and the second bit lines. A first contact hole 47*a* is provided between the first and second insulating patterns 45 to expose the first storage node contact plug 35a. A sidewall of any of the first and the second insulating patterns is patterned to form a second contact hole 47. As a result, an upper part of the second contact hole 47 is wider than a lower part of the second contact hole 47. A second storage node contact plug 50 is provided in the second contact hole. Here, the size of the upper part of the second storage node contact plug is larger than a size of a lower part of the second storage node contact plug.

The second storage node contact plug 50 may have a tapered configuration. Any of the first and the second insulating patterns 45 may include a tapered configuration that is complementary to the second storage node contact plug.

The sidewalls of any of the first and the second insulating patterns 45 may be patterned by implanting impurities into the sidewall of any of the first and the second insulating patterns to form an impurity-implanted region and removing the impurity-implanted region. The implanting process may be tilted implantation. As shown in FIG. 1E, in a device according to the first embodiment of the present invention, first and second bit lines 40 are provided. First and second insulating patterns 45 are provided over the first and the second bit lines, respectively. A first storage node contact plug 35a is provided between the first and the second bit lines 40. A second storage node contact plug 50 that is coupled to the first storage node contact plug 35a is provided between the first and the second insulating patterns 45. The second storage node contact plug 50 is in a tapered configuration so that a size of an upper part of the second storage node contact plug is larger than a size of a lower part of the second storage node contact plug.

Any of the first and the second insulating patterns 45 may be in a tapered configuration that is complementary to the second storage node contact plug 50. For example, the size of an upper portion of any of the first and the second insulating patterns 45 may be smaller than a lower size of any of the first and the second insulating patterns 45.

An upper surface of the first storage node contact plug 35a may extend to a higher level than an upper surface of any of the first and the second bit lines 40 so that the second storage node contact plug 50 is not coupled to any of the first and the second bit lines 40.

A storage node electrode (not shown) coupled to the second storage node contact plug may be further provided.

Figure 2A:
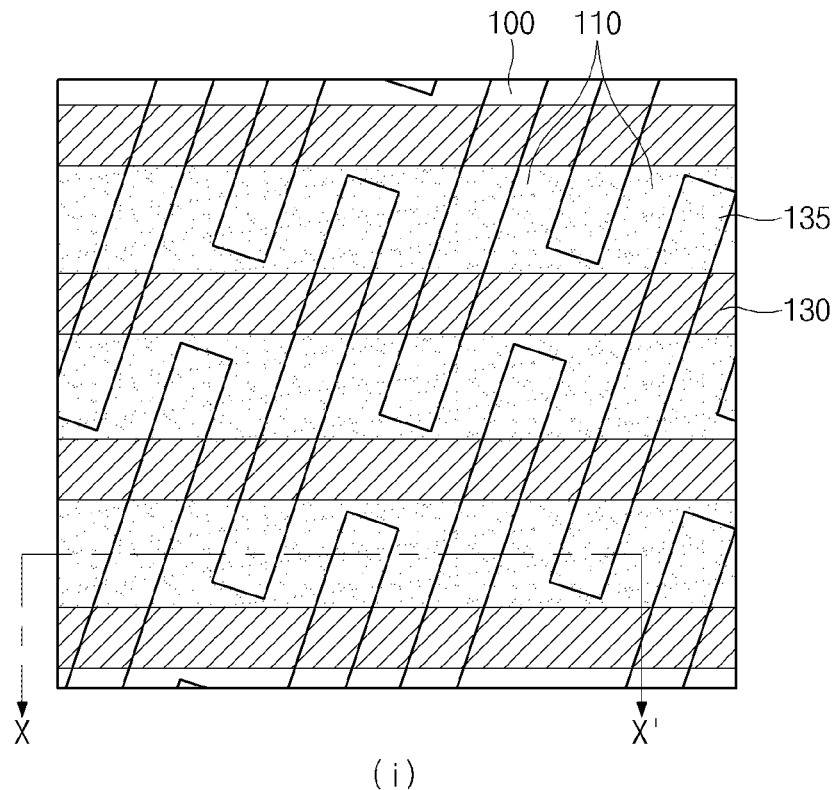
FIGS. 2A to 2F are plan views and cross-sectional views illustrating a semiconductor device and a method for manufacturing the same according to another embodiment of the present invention.
Figure 2A:
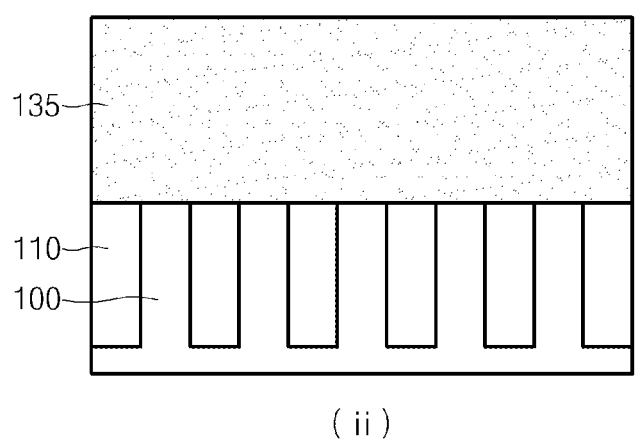

FIGS. 2A to 2F are plan views and cross-sectional views illustrating a semiconductor device and a method for manufacturing the same according to another embodiment of the present invention. FIG. 2A(ii) is a cross-sectional view taken along the line X-X' of FIG. 2A(i), and FIG. 2B(ii) is a cross-sectional view taken along the line X-X' of FIG. 2B(i).

Hereinafter, a method according to a second embodiment of the present invention will be described.

Figure 2B:
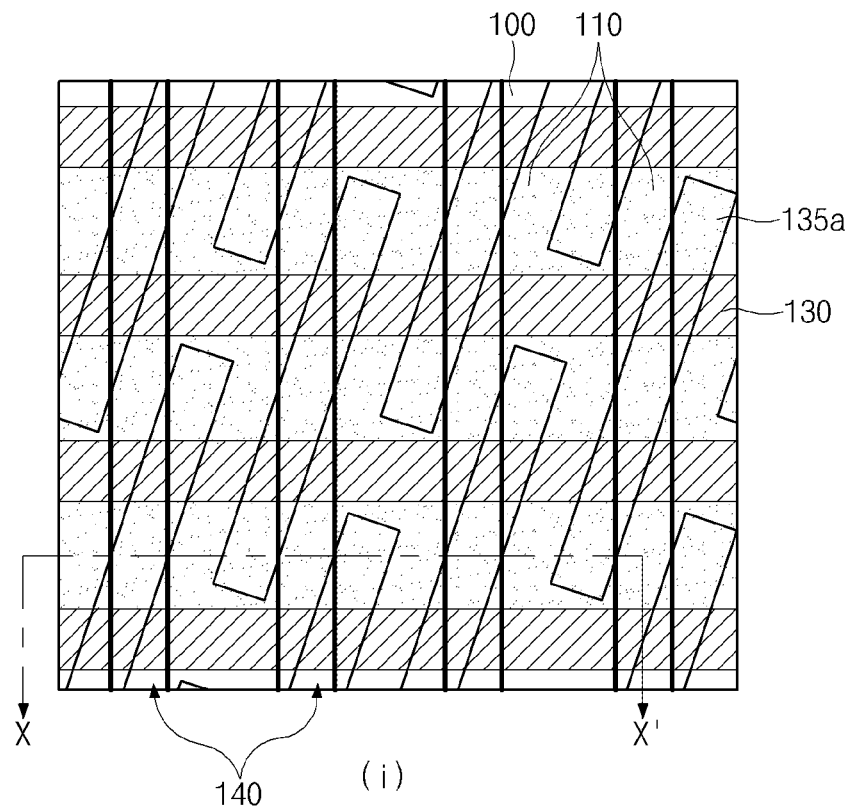
Figure 2B:
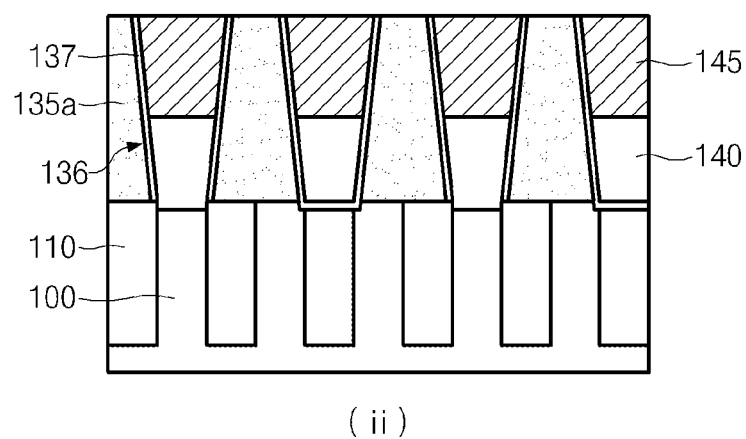

For convenience of description and better understanding of the present invention, the processes of FIGS. 2A and 2B are identical to those of FIGS. 1A and 1B, and as such, a detailed description thereof will be omitted herein.

Figure 2C:
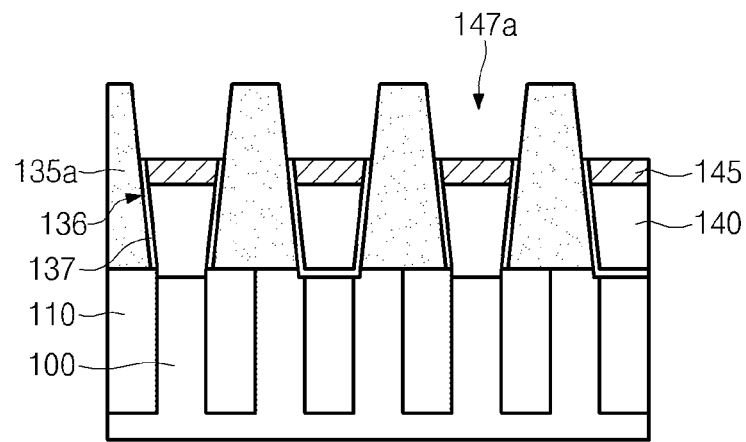

Referring to FIG. 2C, some parts of the bit line hard mask 145 (also referred to as first and second insulating patterns) are removed such that an upper part of the first storage node contact plug 135a, located between the bit line hard masks 145, protrudes. When removing the bit line hard mask 145, a spacer 137 formed of the same material as that of the hard mask 145 is also removed. In an embodiment, the process for partially removing the bit line hard mask 145 is performed using a phosphate solution. Preferably, the bit line hard mask 145 of a predetermined thickness may remain on the bit line conductive material 140 so as to electrically isolate the bit line conductive material 140 and the first storage node contact plug 135a from each other.

Figure 2D:
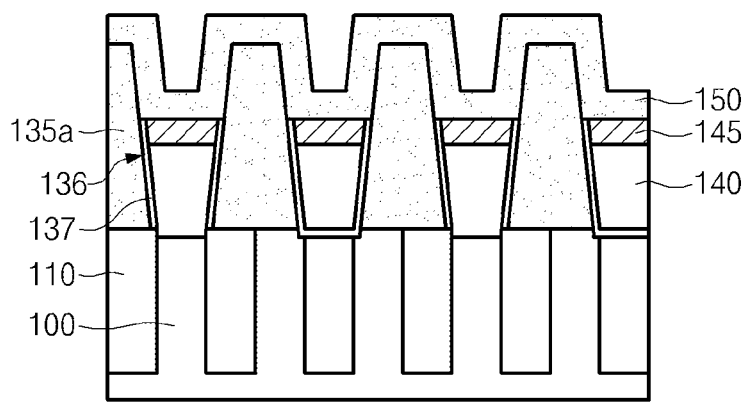

Referring to FIG. 2D, a conductive material 150 is deposited to a predetermined thickness over the bit line hard mask 145 and the protruded first storage node contact plug 135a. In an embodiment, the conductive material 150 may be formed of the same material as the first storage node contact plug 135a. For example, the conductive material 150 may be formed of polysilicon.

Figure 2E:
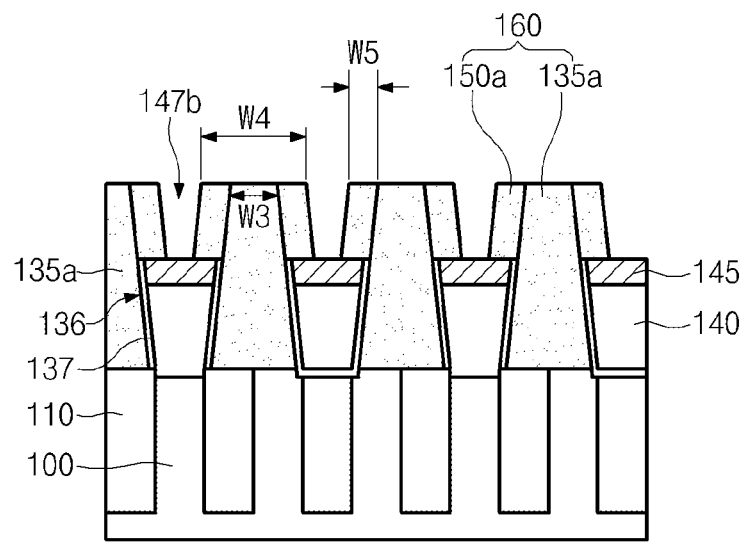

Referring to FIG. 2E, the conductive material 150 is etched by a dry etch-back method, such that the conductive material 150 remains only at a side wall of the protruded first storage node contact plug 135a. The remaining conductive material 150 is defined as a second storage node contact plug 150a. The second storage node contact plug 150a adds a width by W5 to the first storage node contact plug 135a whose width is W3. Thus, an overall width of a storage node contact plug 160, which includes the first and the second storage node contact plugs, becomes W4, which is a sum of W3 and two W5.

Figure 2F:
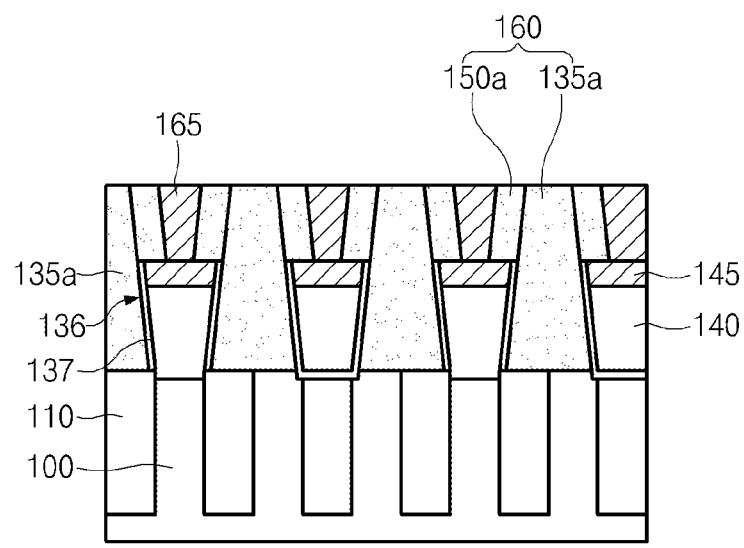

Referring to FIG. 2F, an insulation material 165 is formed over the entire surface including the first storage node contact plug 135a and the second storage node contact plug 150a. The insulation material 165 may be formed of the same material as the hard mask 145. For example, the insulation material may be a nitride film. Thereafter, a CMP or an etch-back process is performed until the first storage node contact plug 135a and the second storage node contact plug 150a are exposed. As described above, since the second storage node contact plug 150a, shaped as a spacer, is additionally formed at a sidewall of the first storage node contact plug 135a, an upper part of the storage node contact plug 160 according to an embodiment of the present invention is larger in size than that of the first storage node contact plug 135a. As a result, resistance of the storage node contact plug 160 is reduced so that device characteristics can be improved.

As described above, according to the second embodiment, first and second storage node contact plugs 135a are provided. A bit line 140 is provided between the first and second storage node contact plugs 135a. A first contact hole 147a is provided between the first and second storage node contact plugs to expose the bit line. The first contact hole 147a has a first width. A third storage node contact plug 150a is provided at a sidewall of the first contact hole 147a to form a second contact hole 147b. The second contact hole 147b has a second width smaller than the first width. The third storage node contact plug 150a is coupled to any of the first and the second storage node contact plugs 135a.

The third storage node contact plug 150a extends from any of the first and the second storage node contact plugs 135a. A storage node electrode (not shown) may be further provided so as to couple to (i) any of the first and the second storage node contact plug and/or (ii) the third storage node contact plug.

As shown in FIG. 2F, in the second embodiment, the device includes the first storage node contact plug 135a and the second storage node contact plug 150a. A bit line 140 is provided between the first and second storage node contact plugs. The second storage node contact plug 150a is disposed over a sidewall of any of the first storage node contact plugs 135a and is disposed over the bit line 140. A top surface of the bit line 140 is at a lower level than a top surface of the first storage node contact plugs 135a. A first insulating pattern 145 may be provided between the bit line 140 and the second storage node contact plug 150a.

As is apparent from the above description, the semiconductor device and the method for manufacturing the same according to embodiments of the present invention have the following effects. In the semiconductor device, an upper part of a storage node contact plug is increased in size, and an area of overlap between the storage node contact plug and a storage node to be formed in a subsequent process is increased. As a result, resistance of the storage node contact plug is increased and device characteristics are improved.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
   first and second bit lines, the first bit line including a first bit line conductive layer and a first bit line hard mask, the second bit line including a second bit line conductive layer and a second bit line hard mask, the first and second bit line hard masks provided over the first and the second bit line conductive layers, respectively;
   a first storage node contact plug provided between the first and the second bit line conductive layers;
   a second storage node contact plug coupled to the first storage node contact plug and provided between the first and the second bit line hard masks;
   a third storage node contact plug and a fourth storage node contact plug coupled to the third storage node contact plug; and
   a bit line groove defined by the first and second storage node contact plugs and the third and fourth storage node contact plugs,
   wherein the first bit line conductive layer is buried in a lower portion of the bit line groove,
   wherein the first bit line hard mask is buried in an upper portion of the bit line groove, and
   wherein a size of the second storage node contact plug at a top surface level of the second storage node contact plug is larger than a size of the second storage node contact plug at a bottom surface level of the second storage node contact plug.

2. The semiconductor device of claim 1, wherein the second storage node contact plug includes a first tapered configuration, and
   wherein any of the first and the second bit line hard masks includes a second tapered configuration that is complementary to the second storage node contact plug.

3. The semiconductor device of claim 1, wherein a top surface of the first storage node contact plug extends to a higher level than top surfaces of the first and the second bit line conductive layers so that the second storage node contact plug is not coupled to any of the first and the second bit line conductive layers.

4. The semiconductor device of claim 1, wherein top surfaces of the first and second bit line hard masks are formed at substantially the same level as a top surface of the second storage node contact plug.

5. A method for manufacturing a semiconductor device comprising:
   providing first and second bit line conductive layers;
   providing first and second bit line hard masks over the first and the second bit line conductive layers, respectively;
   providing a first storage node contact plug between the first and the second bit line conductive layers, wherein a size of the first storage node contact plug at a top surface level of the first storage node contact plug is smaller than a size of the first storage node contact plug at a bottom surface level of the first storage node contact plug;
   providing a first contact hole over the first storage node contact plug and between the first and the second bit line hard masks;
   enlarging a size of the first contact hole to form a second contact hole so that a size of a top opening of the second contact hole is larger than a size of a bottom opening of the second contact hole; and
   providing a second storage node contact plug in the second contact hole so that the second storage node contact plug is coupled to the first storage node contact plug.

6. The method of claim 5, further comprising:
   implanting ions into portions of the first and second bit line hard masks such that the implanted portions have an amorphous state.

7. The method of claim 6, wherein the implanted ions are argon (Ar) ions.

8. The method of claim 6, wherein enlarging the size of the first contact hole includes:
   etching the ion-implanted portions of the first and second bit hard masks at an etch rate higher than an etch rate for remaining portions of the first and second bit hard masks.

9. The semiconductor device of claim 1, wherein a size of the first storage node contact plug at a top surface level of the first storage node contact plug is smaller than a size of the first storage node contact plug at a bottom surface level of the first storage node contact plug.

* * * * *